(12) United States Patent
Akiyama

(10) Patent No.: US 8,288,251 B2
(45) Date of Patent: Oct. 16, 2012

(54) METHOD FOR PREPARING SOI SUBSTRATE HAVING BACKSIDE SANDBLASTED

(75) Inventor: Shoji Akiyama, Gunma-ken (JP)

(73) Assignee: Shin-Etsu Chemical Co., Ltd. (JP)

( * ) Notice: Subject to any disclaimer, the term of this patent is extended or adjusted under 35 U.S.C. 154(b) by 0 days.

(21) Appl. No.: 12/766,985

(22) Filed: Apr. 26, 2010

(65) Prior Publication Data

US 2010/0279488 A1 Nov. 4, 2010

(30) Foreign Application Priority Data

Apr. 30, 2009 (JP) ................... 2009-110790

(51) Int. Cl.
*H01L 21/30* (2006.01)
(52) U.S. Cl. ................. 438/459; 438/690; 257/E21.239
(58) Field of Classification Search .................. 438/459, 438/458, 455, 690, 693
See application file for complete search history.

(56) References Cited

U.S. PATENT DOCUMENTS

| | | | |
|---|---|---|---|
| 6,263,941 B1 | 7/2001 | Bryan et al. | |
| 6,513,564 B2 | 2/2003 | Bryan et al. | |
| 6,582,999 B2 | 6/2003 | Henley et al. | |
| 2004/0259324 A1 | 12/2004 | Brask et al. | |
| 2008/0261381 A1* | 10/2008 | Akiyama et al. | 438/459 |

FOREIGN PATENT DOCUMENTS

| | | |
|---|---|---|
| EP | 1983575 A2 | 10/2008 |
| EP | 2053650 A2 | 4/2009 |
| JP | 05-211128 | 8/1993 |
| JP | 2004-311526 | 11/2004 |
| JP | 2005-101630 | 4/2005 |
| JP | 2008-288556 | 11/2008 |

OTHER PUBLICATIONS

European Search Report corresponding to European Patent Application No. 10161579 dated Aug. 10, 2010.
Ohmi et al. "SOI No Kagakuk", *Realize Science & Engineering Center Co., Ltd.* Section 2, Paragraph 2 (2000).
Japanese Office Action corresponding to Japanese Application No. 2009-110790 mailed Sep. 27, 2011.
Auberton-Herve "Smart Cut Technology: Industrial Status of SOI Wafer Production and New Material Developments", *Electrochemical Society Proceedings* 99-3:93-106 (1999).

* cited by examiner

*Primary Examiner* — Charles Garber
*Assistant Examiner* — Reema Patel
(74) *Attorney, Agent, or Firm* — Myers Bigel Sibley & Sajovec, PA

(57) ABSTRACT

Provided is a method of preparing an SOI substrate having a backside roughened which the SOI substrate has a reduced number of defects in a silicon layer at the front surface in spite of sandblasting having been applied to the backside of the SOI substrate. Specifically provided is the method comprising the steps of: etching 10 nm or more of a surface of a silicon film of an SOI substrate; sandblasting a backside of the SOI substrate with protective tape attached to the etched surface of the silicon film, the back side being the other side of the SOI substrate from the etched surface; removing the protective tape after the sandblasting; and polishing and cleaning a silicon film surface from which the protective tape has been removed.

12 Claims, 5 Drawing Sheets

METHOD FOR PREPARING SOI SUBSTRATE HAVING BACKSIDE SANDBLASTED

CROSS-RELATED APPLICATIONS

This application claims priority from Japanese Patent Application No. 2009-110790; filed Apr. 30, 2009, the disclosure of which is incorporated herein by reference in its entirety.

BACKGROUND OF THE INVENTION

1. Field of the Invention

The present invention relates to an SOI (Silicon On Insulator) substrate having a backside roughened and, more specifically, to a method of fabricating an SOI substrate having a backside sandblasted.

2. Description of the Related Art

As a method of preparing an SOQ (Silicon On Quartz) substrate, an SOG (Silicon On Glass) substrate, or the like, the SOITEC (Smart Cut) process developed by the Silicon On Insulator Technologies or the SiGen process developed by the Silicon Genesis Corporation has been used.

The SOITEC process is a method of obtaining an SOI substrate. According to the SOITEC process, a silicon substrate (donor substrate) into which hydrogen ions have been implanted through its surface to be bonded, and an insulating substrate (handle substrate) such as a quartz substrate or a glass substrate are bonded together; and the thus-bonded substrates is heated at a temperature of 400° C. or higher (e.g., at 500° C.) to thermally peel off a silicon film at a region with a highest concentration of implanted hydrogen ions (e.g., Japanese Patent No. 3048201, and Auberton-Herve, A. J. et al., "Smart Cut Technology: Industrial Status of SOI Wafer Production and New Material Developments," Electrochemical Society Proceedings, Vol. 99-3 (1999) pp. 93-106). This process is based on a mechanism in which high-density "air bubbles," called "microcavities" and formed by hydrogen ion implantation, are grown by heating, and a silicon film is peeled off by taking advantage of this "air bubble growth."

The SiGen process is a method of obtaining an SOI substrate. According to the SiGen process, plasma treatment is applied to both or either of a surface of a silicon substrate (donor substrate) into which hydrogen ions have been implanted through the surface to be bonded, and a surface of an insulating substrate (handle substrate) to be bonded such as that of a quartz substrate or a glass substrate; the two substrates are then bonded together with both or either of the surfaces being activated; heat treatment is applied to the two bonded substrates at a low temperature (e.g., at a temperature of 100 to 300° C.) to increase the bond strength of the two bonded substrates; and the silicon film is mechanically peeled off at ordinary temperature (e.g., U.S. Pat. Nos. 6,263,941, 6,513,564, and 6,582,999).

A main difference between the two processes lies in the step of peeling off a silicon film. The SOITEC process requires high temperature treatment for peeling off the silicon film, while the SiGen process allows the silicon film to be peeled off at ordinary temperature.

The SOITEC process, which requires high temperature for peeling off a silicon film, is susceptible to damage such as fracture and local cracking due to difference in thermal characteristics such as a thermal expansion coefficient when the handle substrate is made of a material different from silicon.

On the other hand, the SiGen process, which allows the silicon film to be peeled off at low temperature, is less susceptible to fracture and local cracking due to difference in thermal characteristics. However, this process is apt to allow the silicon film, which has been bonded to the handle substrate, to come off from the handle substrate at the bonded surface during the step of peeling, or apt to leave a trace of peeling or mechanically damage on the silicon film. That is because the silicon film is mechanically peeled off.

It has been known that damage due to the thermal or mechanical peeling becomes more significant toward the surface region (Ohmi, T. et al., "SOI No Kagaku", published by Realize Science & Engineering Center Co., Ltd. in 2000, Chapter 2, Section 2, Paragraph 2).

It has also been known that sandblasting is used in the fogging (frosting) of $SiO_2$-based substrates and parts made of glass, quartz and the like, sapphire-based substrates and parts, and the like. This is a method in which fine alumina or silica powder is sprayed onto a surface which is intended to be roughened, and widely used for various purposes.

SUMMARY OF THE INVENTION

This technique is applicable to an SOI (Silicon On Insulator) substrate in which a silicon film is laminated to a handle substrate. It is applicable particularly to SOQ (Silicon On Quartz) substrates, SOG (Silicon On Glass) substrates, SOS (Silicon On Sapphire) substrates and the like to which a single-crystal silicon film is laminated because these substrates are introduced in a CMOS process as for general silicon wafers. It is important that the backside should be roughed in terms of preventing slips for automated robotic transfer and facilitating the responsiveness to transfer sensors.

How fogging, non-slip finishing and the like can be performed by sandblasting in the field of electronic materials and devices will be considered.

In sandblasting, the silicon side needs to be protected so as to prevent fine powder from making a scratch on a silicon layer. An easiest way may be considered to be the method in which protective tape (e.g., protective tape for backgrinding or dicing) widely used in a semiconductor process is attached to the silicon side, the tape is removed after sandblasting, and then the silicon surface is polished and cleaned. Since some foreign substances and organic substances, and fine scratches are introduced into the silicon surface due to the attachment of the tape, the rational procedure may be considered to be a method comprising the steps of attaching tape, sandblasting, removing the tape, and polishing and cleaning in this order. For example, when an SOQ substrate or an SOG substrate is prepared by the SiGen process or the SOITEC process, an appropriate subsequent procedure may be considered to be a method comprising the steps of, as shown in FIG. 4, attaching tape, sandblasting, removing the tape, and polishing and cleaning in this order after the film is transferred by peeling.

However, the present inventors have found that in the method using protective tape, when the protective tape is removed, damaged portions and/or defective portions in the surface are removed with the tape, or defects are enlarged. The problem is that the surface of the peeled silicon film is very difficult to be handled because the surface of the peeled silicon film is amorphous and has fine cracks introduced therein. Accordingly, the present invention provides a method for preparing an SOI substrate having a backside roughened in which the number of defects in a silicon layer at the front surface is small in spite of sandblasting being applied to the backside of the SOI substrate.

The inventors prepared SOI substrates by using the methods exemplified by the SiGen process and the SOITEC process, and observed the surfaces of peeled silicon films thereof.

In these methods, the thickness of a transferred film is determined by the depth at which hydrogen ions have been implanted into a silicon substrate. As a result of cross-sectional TEM (Transmission Electron Microscope) observation, it was found that amorphous portions and/or very small damages remained at the surface of the silicon film immediately after peeling, and the depth thereof ranged from 100 to 200 nm or more.

FIG. 5 shows a cross-sectional TEM image of an SOQ substrate immediately after peeling which was obtained by a preparation method described later. An SOQ substrate 5 comprises an insulating substrate (quartz substrate) 1 and a silicon film 2. The silicon film 2 comprises, in sequence from the side in contact with the insulating substrate, a single-crystal portion 21, a portion 2b partially containing remaining damages, a damaged portion 2c and the peeled surface 2d. FIG. 5 shows a damaged layer having a thickness of approximately 150 nm.

The inventors have found that a defective portion in the silicon film which will be produced as tape is removed can be reduced by attaching protective tape to the surface of the silicon film after at least part of the damaged layer at the surface of the silicon film is removed; and then sandblasting the backside of the SOI substrate. Thus, the inventors have completed the present invention.

Specifically, the present invention provides a method for preparing an SOI substrate having a backside roughened, comprising the steps of:

etching 10 nm or more of a surface of a silicon film of an SOI substrate;

sandblasting the backside of the SOI substrate with protective tape attached to the etched surface of the silicon film, the backside being the other side of the SOI substrate from the etched surface;

removing the protective tape after the sandblasting; and polishing and cleaning a silicon film surface from which the protective tape has been removed.

According to the present invention, a defective portion of the silicon film which will be produced as the tape is removed can be reduced, even though sandblasting is applied to the backside of an SOI substrate with protective tape attached to the surface of the silicon film of the SOI substrate, wherein the backside is the surface of an insulating substrate which is the opposite side of the SOI substrate from a silicon film. This makes it possible to sandblast the backside of an SOI substrate for the purpose of doing things such as non-slip finishing and fogging (frosting).

DETAILED DESCRIPTION OF THE PREFERRED EMBODIMENTS

Figure 1:
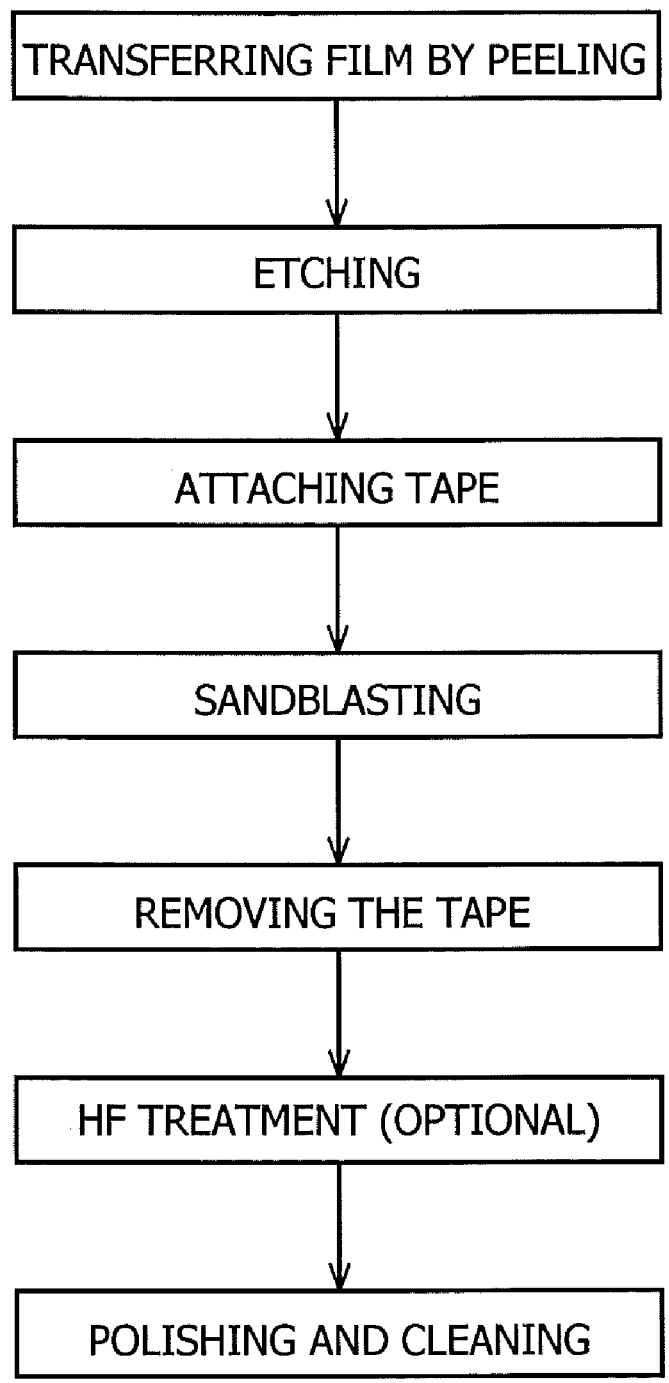
FIG. 1 is a flowchart showing a method from the step of transferring a film by peeling to the step of polishing and cleaning.

The present invention now will be described more fully hereinafter in which embodiments of the invention are provided with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art.

The terminology used in the description of the invention herein is for the purpose of describing particular embodiments only and is not intended to be limiting of the invention. As used in the description of the invention and the appended claims, the singular forms a", "an" and "the" are intended to include the plural forms as well, unless the context clearly indicates otherwise.

Unless otherwise defined, all technical and scientific terms used herein have the same meaning as commonly understood by one of ordinary skill in the art to which this invention belongs.

The present invention can be applied to an SOI substrate having a backside requiring sandblasting for the purpose of doing things such as non-slip finishing and fogging (frosting).

The SOI substrate can be prepared by bonding together a single-crystal silicon substrate, which is a donor substrate providing a silicon film, and an insulating substrate which is a handle substrate.

The insulating substrate may include, but not limited to, a quartz substrate, a glass substrate (e.g., a borosilicate glass wafer, a crystallized glass wafer or the like), a sapphire substrate, an alumina substrate, an aluminum nitride substrate or the like. The quartz substrate, the glass substrate and the sapphire substrate may be preferably from a viewpoint of fogging (frosting).

Accordingly, the present invention can preferably be applied to an SOG substrate, an SOQ substrate and an SOS substrate as an SOI substrate.

In the present invention, an SOI substrate may be obtained by the SOITEC process or the SiGen process (including modification of these processes). The SOI substrate may be preferably obtained by a preparation method comprising: an ion implantation step of implanting hydrogen ions into a surface of a single-crystal silicon substrate to form a ion-implanted layer in the single-crystal silicon substrate; a bonding step of bonding together an insulating substrate and the ion-implanted surface of the single-crystal silicon substrate; and an peeling step of peeling off a silicon film on the insulating substrate at the ion-implanted layer after the bonding step, thereby obtaining an SOI substrate having a silicon film transferred onto the insulating substrate, wherein the silicon film of the SOI substrate to be etched is the transferred silicon film. There are also many reports on the modified methods of the SOITEC process and the SiGen process. One of the examples is described by JP 2007-220900A.

The thickness of the insulating substrate may not be particularly limited. The thickness of the insulating substrate may be preferably close to that of a silicon wafer specified by the SEMI (Semiconductor Equipment and Materials International) and the like. This is because it is often specified that semiconductor equipment should use wafers having such a thickness. From this point of view, the thickness may be preferably 300 to 900 μm.

The single-crystal silicon substrate may include, but not limited to, a substrate being obtained by slicing a single crystal which has been grown by, for example, the Czochralski process, and having, for example, a diameter of 100 to 300 mm, p- or n-type conductivity, and a resistivity of approximately 10 Ω·cm.

The single-crystal silicon substrate may preferably contain a insulating film formed beforehand on the surface of the single-crystal silicon substrate. This is because the hydrogen ion implantation through the insulating film has the effect of reducing the channeling of implanted ions. The insulating film may be preferably a silicon oxide film preferably having a thickness of 50 to 500 nm. When it is too thin, controlling the thickness of the oxide film may be difficult. When it is too thick, it may take long time to form the silicon oxide film. The silicon oxide film can be formed by a commonly-used thermal oxidation process.

Figure 6:
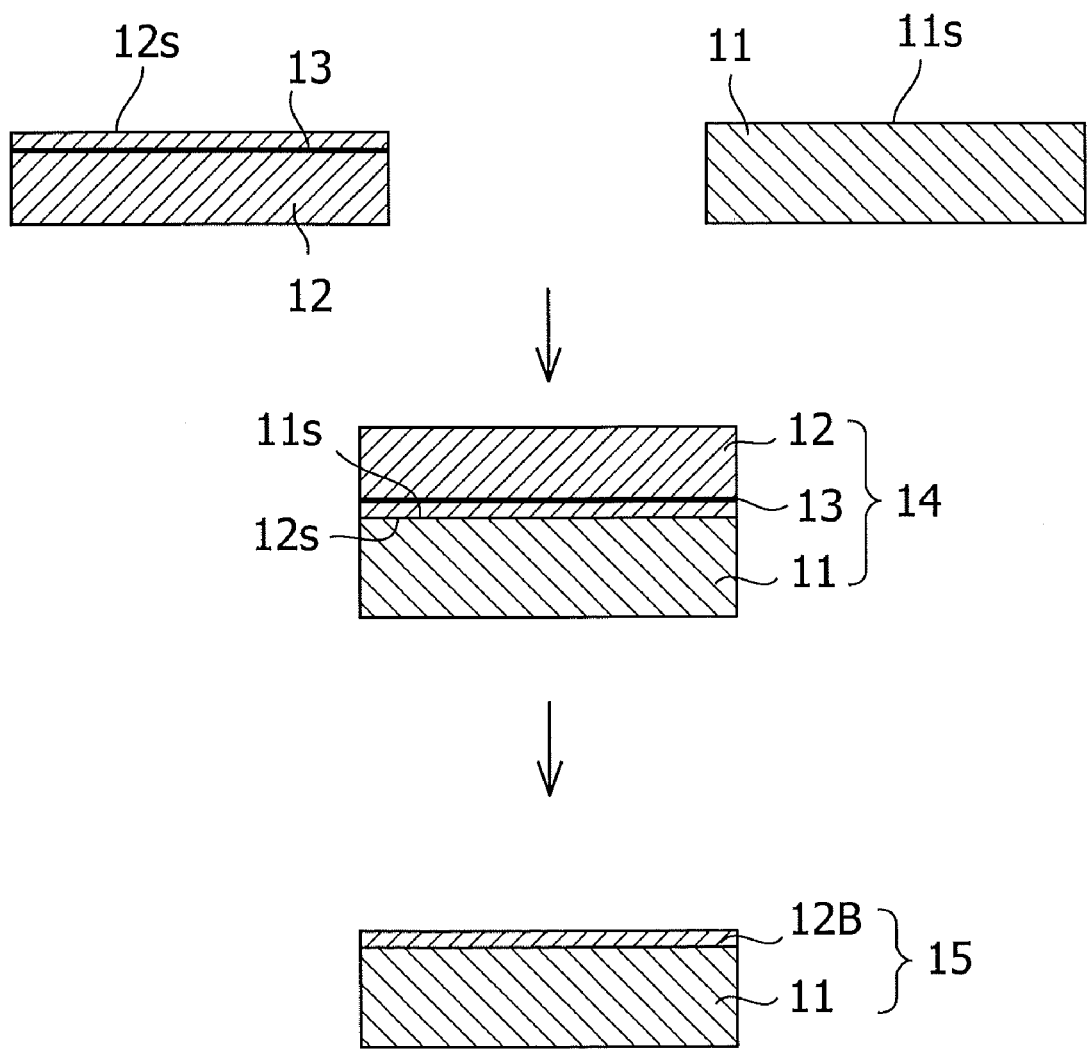
FIG. 6 shows an example of a method for preparing an SOI substrate.

Hereinafter, a method for preparing an SOI substrate will be described based on an example shown in FIG. 6.

Hydrogen ions are implanted into a single-crystal silicon substrate 12 from a surface 12s thereof. Thus, an ion-implanted layer is formed in the silicon substrate. At this time, the temperature of the single-crystal silicon substrate 12 is, for example, 250 to 450° C., and hydrogen ions and/or inert gas ions are implanted with a predetermined dose at such an implantation energy that an ion-implanted layer can be formed up to a desired depth from the surface of the single-crystal silicon substrate 12. As conditions for this, for example, the implantation energy can be set at 50 to 100 keV and the implantation dose can be set to $2 \times 10^{16}$ at $1 \times 10^{17}/cm^2$.

The hydrogen ions to be implanted may be preferably hydrogen ions ($H^+$) with a dose of $2 \times 10^{16}$ to $1 \times 10^{17}$ (atoms/$cm^2$) or hydrogen molecular ions ($H_2^+$) with a dose of $1 \times 10^{16}$ to $5 \times 10^{16}$ (atoms/$cm^2$).

The depth from the ion-implanted surface 12s of the single-crystal silicon substrate 12 to the ion-implanted layer 13 thereof depends on a desired thickness of a silicon film to be provided on an insulating substrate 11. The depth may be preferably 300 to 500 nm, more preferably approximately 400 nm. The thickness of the ion-implanted layer 13 is preferably such a thickness that the ion-implanted layer 13 can be easily peeled off by mechanical impact. The thickness may be preferably 200 to 400 nm, more preferably approximately 300 nm. The thickness of the single-crystal silicon substrate 12 may not be particularly limited as long as the single-crystal silicon substrate can contain such an ion-implanted layer. However, when the thickness of the single-crystal silicon substrate is too large, it is not economical. The thickness may be usually 500 to 800 μm.

Surface activation treatment may be applied to both or either of the hydrogen ion-implanted surface 12s of the single-crystal silicon substrate 12 in which the hydrogen ion implanted layer 13 is provided beforehand by implanting hydrogen ions therein, and a surface 11s of the insulating substrate 11. The surface activation treatment is treatment for increasing OH groups in a surface to achieve activation, and may be, for example, plasma treatment, ozonization, or a combination of both.

Next, the hydrogen ion-implanted surface 12s and the surface 11s of the insulating substrate are bonded together to form a bonded substrate 14. A certain level of bond strength can be ensured at this time by, for example, the bonding. When the activation treatment has been applied to at least one of the ion-implanted surface 12s of the single-crystal silicon substrate 12 and the surface 11s of the insulating substrate 11, these substrates can be firmly bonded together with a strength high enough to withstand mechanical peeling in a later step, only by bringing the substrates into close contact together under reduced or normal pressure, preferably at a temperature around a general room temperature (approximately 20° C.) without cooling or heating. Heating may be applied to increase the bond strength.

A silicon film 12B is peeled off by, for example, applying a mechanical impact to the hydrogen ion implanted layer 13 of the bonded substrate 14. Thus, an SOI substrate 15 having a silicon film transferred to the insulating substrate 11 is obtained. The impact can be applied to the ion-implanted layer by continuously or intermittently spraying a jet of fluid, e.g., gas, liquid or the like, at the side of the bonded wafer.

A method of preparing an SOI substrate having a backside sandblasted will be explained on the basis of FIG. 1.

The SOI substrate after peeling is subjected to etching in an etching step. In this step, the surface of the silicon film of the SOI substrate is etched.

The etching may be preferably performed with an alkaline etchant. The alkaline etchant may preferably contain one or more selected from the group consisting of an ammonium-hydrogen peroxide mixture, ammonia, potassium hydroxide, sodium hydroxide, cesium hydroxide, tetramethyl ammonium hydroxide (TMAH), an ethylene diamine-pyrocatechol-water mixture (EDP) and hydrazine. The ammonium-hydrogen peroxide mixture is a mixture of ammonium hydroxide, hydrogen peroxide and water, and may be, for example, an SC1 solution used for RCA cleaning of silicon wafers, preferably an SC1 solution having an etching effect enhanced by reducing the amount of aqueous hydrogen peroxide.

With regard to preferable concentration ranges, for example, in the preferable composition of the SC1 solution, a weight ratio of $NH_4OH$ to $H_2O$ ($NH_4OH/H_2O$) may be 0.05 to 2 /10, and a weight ratio of $H_2O_2$ to $H_2O$ may be 0.01 to 0.05 /10.

Although the solvent of the alkaline solution may be generally water, it may not be particularly limited. The alkali concentration of the alkaline solution may not be particularly limited.

The temperature for the etching may be preferably room temperature to 80° C. The etched amount can be changed by changing the composition of the etchant, treatment temperature, immersion time, and/or the like.

An etched amount effective in reducing defects is not less than 10 nm, preferably not less than 20 nm, and the upper limit thereto may be 150 nm. Although the etching may be performed beyond the upper limit, this may be meaningless in terms of the removal of a damaged layer.

The backside of the SOI substrate, which is the other side of the SOI substrate from the etched surface, is sandblasted, while protective tape is attached to the etched surface of the silicon film.

The protective tape may not be particularly limited as long as the protective tape can protect the surface of the silicon film during the sandblasting. The protective tape may be preferably of an ultraviolet-curing tape having its adhesiveness decreased by ultraviolet irradiation. The protective tape may be preferably protective tape for backgrinding, tape for dicing, or tape for die bonding.

The sandblasting can be performed using a well-known method. For example, fine powder for the blasting may include alumina or silica powder having an average particle size of 5 to 50 μm. The sandblasting can be performed with a commercial apparatus.

After the sandblasting, the protective tape is removed. The surface of the silicon layer from which the protective film has been removed is polished and cleaned. Thus, an SOI substrate having a backside roughened is obtained.

In the step of removing the protective tape, for the convenience of the treatment, the tape may be removed preferably after cleaning of the backside with a solution containing HF as additional treatment following the sandblasting. The solution containing HF may be preferably, for example, 1 to 49% by volume hydrofluoric acid or buffered hydrofluoric acid (BHF: Buffered HF).

Subsequently, a polishing and cleaning step is performed.

Although the polishing is not particularly limited, it may be chemical mechanical polishing (CMP) which is commonly used in semiconductor processes.

Although the cleaning is not particularly limited, it may be RCA cleaning which is generally used in semiconductor processes.

Figure 3:
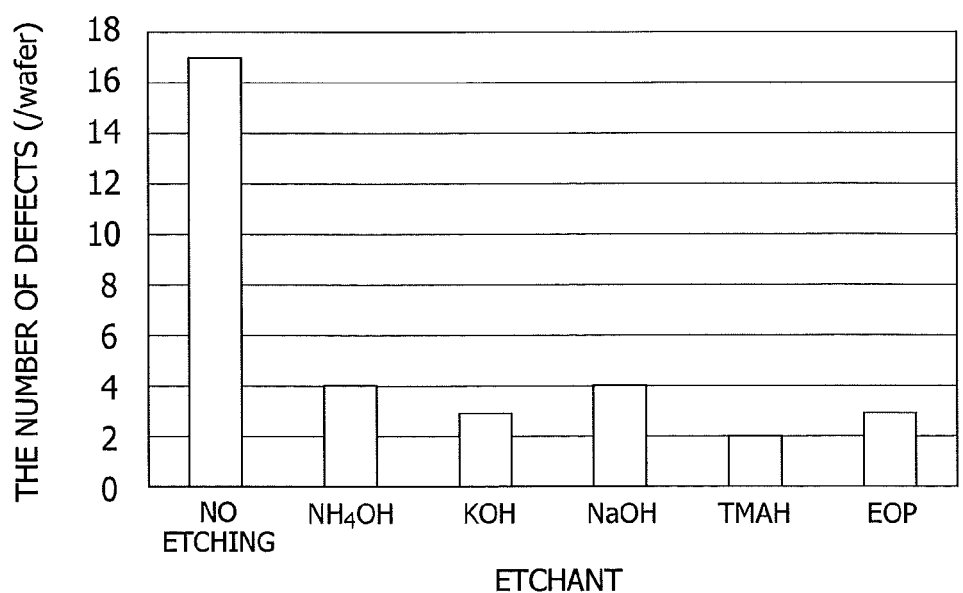
FIG. 3 shows a graph exhibiting a relationship between the type of alkaline solution used and the number of defects in the silicon surface of the obtained SOQ substrate.
Figure 4:
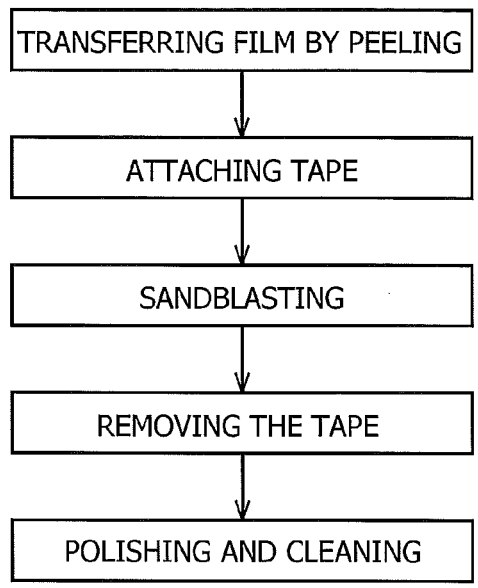
FIG. 4 is a conceivable flowchart exhibiting a method from the step of transferring a film by peeling to the step of polishing and cleaning.

It has been found that the SOI substrate prepared by the process shown in FIG. 1 has a reduced number of crystal defects as shown in FIG. 3.

In the sandblasting step, the backside (side other than the silicon film) of the SOI substrate which is to be sandblasted may be preferably cleaned to remove organic contaminants from before the sandblasting. In some cases, many organic contaminants adhere to the backside of the SOI substrate. Removing these organic contaminants before the sandblasting allows the silicon film to be uniformly polished after the sandblasting, thereby reducing such unevenness in film thickness that the silicon film would be locally thin.

FIG. 7 shows a mechanism assumed to be involved in unevenness in film thickness which is produced when the thin silicon film is polished after the backside of the SOT substrate having organic contaminants on the backside thereof is sandblasted.

Figure 7A:
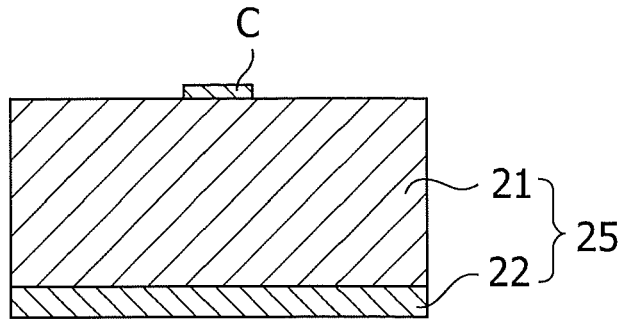
FIGS. 7A to 7D show a mechanism assumed to be involved in unevenness in film thickness which is caused when a silicon film is polished after the backside of an SOI substrate having organic contaminants on the backside thereof is sandblasted.

As shown in FIG. 7(A), an organic contaminant C is present on an SOI substrate 25 having a silicon film 22 on an insulating substrate 21. The organic contaminant C is, for example, adhesive, oil or the like, and adheres to the insulating substrate 21 in the environment or during the handling of the wafer. The size of the organic contaminant C could range widely, but is generally approximately 1 µm to 900 µm with consideration given to the magnitude of influence on unevenness in film thickness. That is because if the organic contaminant C is larger than this range, the organic contaminant C is highly likely to be blown away by sandblasting; and if the organic contaminant C is smaller than this range, the organic contaminant C is less likely to be left as a projection such as described later.

Figure 7B:
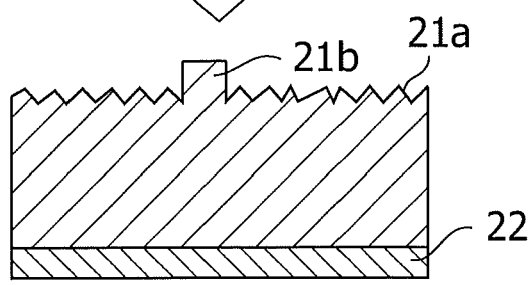

After the sandblasting is performed, as shown in FIG. 7(B), the blasted surface of the insulating substrate 21 is roughened, and, at the same time, approximately several hundred nanometers to several micrometers of the blasted surface is removed. Accordingly, an untreated portion 21b is left as a projection. In other words, the untreated portion 21b exists as well as a sandblasted portion 21a. In the sandblast, since fine powder is sprayed at high pressure, most foreign substances are removed during the treatment. However, organic contaminants, which are highly adhesive, function as masks to obstruct uniform sandblasting. In general, sandblasting can be a process which is difficult to perform in a clean environment because the process produces dust. The size of the untreated portion 21b is generally 50 to 200 µm. That is because if the untreated portion 21b is larger than this range, the untreated portion 21b is highly likely to be blown away by sandblasting; and if the untreated portion 21b is smaller than this range, the untreated portion 21b is less likely to be left as a projection.

Figure 7C:
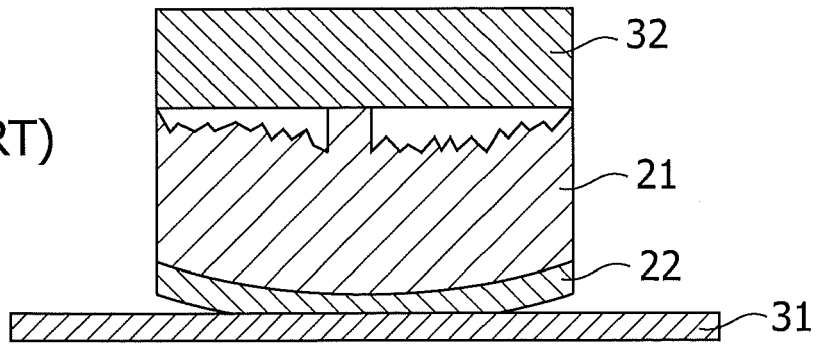
Figure 7D:
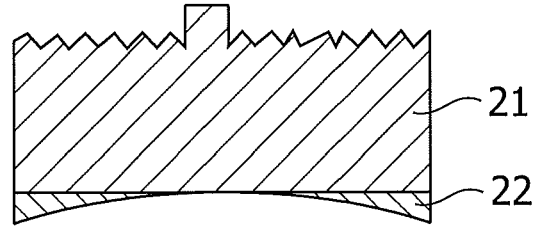

As shown in FIG. 7(C), for example, the backside of the SOI substrate 25 having the untreated portion 21b is fixed to a wafer chuck 32 of a polisher, while the silicon film 22 is polished with polishing cloth 31. As a result, as shown in FIG. 7(D), the portion of the silicon film 22 corresponding to the untreated portion 21b is polished more heavily. Consequently, the SOI substrate 25 has unevenness in film thickness.

Organic contaminants can be removed with a cleaning fluid. The cleaning fluid is not particularly limited as long as the cleaning fluid is effective in removing organic contaminants. The cleaning fluid may preferably be an organic solvent, an acid solution, or an alkaline solution from the point of view of convenience, price and the like.

Examples of the preferable organic solvent may include an alcohol such as methanol, ethanol or isopropyl alcohol (IPA); ketone such as acetone; aromatic hydrocarbon such as toluene; and a combination of any of the foregoing. The organic solvent may preferably comprise one or more selected from the group consisting of methanol, ethanol, isopropyl alcohol, acetone and toluene. More preferably, the organic solvent may be preferably ethanol or isopropyl alcohol.

The acid may be sulfuric acid or SPM (sulfuric acid-hydrogen peroxide mixture), which is a mixture of sulfuric acid, hydrogen peroxide and water. A preferable concentration of each of sulfuric acid and hydrogen peroxide may be 30 to 98% by weight, and the volume ratio may be preferably 1:1 to 4:1 ((98% by weight sulfuric acid):(30% by weight aqueous hydrogen peroxide)). The alkaline solution may preferably be one or more selected from the group consisting of ammonia; APM which is a mixture of ammonium hydroxide, hydrogen peroxide and water; potassium hydroxide; sodium hydroxide; cesium hydroxide; tetramethyl ammonium hydroxide (TMAH); an ethylene diamine-pyrocatechol-water mixture (EDP); and hydrazine. The alkali concentration for use is not particularly limited. The concentration of OH$^-$, [OH$^-$], may be preferably not less than 0.002 mol/L. The preferable range of the alkali concentration of APM may be the same range as that described as an example of the alkali concentration of alkaline etchant. The preferable range of the alkali concentration of EDP may be is 100% by weight. The preferable range of the alkali concentration of TMAH may be 2 to 50% by weight.

The organic contaminant removal is aimed not at removing particles on the substrate but at removing organic substances.

The organic contaminant removal may be performed by a method in which organic contaminants are wiped away with cloth, paper or the like moistened with organic solvent; or a method in which the substrate is immersed in an organic solvent, an acid solution or an alkaline solution to be cleaned. Both methods are effective, but in the case where organic contamination may occur when the substrate to be treated is set on a sandblasting apparatus, the method in which organic contaminants are wiped away with cloth, paper or the like moistened with organic solvent after the substrate is set can be simple and effective.

EXAMPLES

The present invention will be described based on examples and comparative examples, but it should not be construed that the present invention is limited to the examples.

<Preparation of SOQ Substrates>

The size of each wafer used was 150 mm.

As an SOQ substrate, an SOQ wafer (diameter: 150 mm, silicon film thickness: 325 nm, quartz substrate thickness: 625 µm) was used, which was prepared by the method described below.

The SOQ wafer was prepared as follows. Plasma activation treatment was applied to a silicon wafer having an oxide film into which hydrogen ions had been implanted beforehand. Subsequently, the silicon wafer and a quartz wafer were bonded together. After heat treatment at 250° C. for 24 hours, thin film transfer was performed by mechanical peeling at the ion implantation interface.

Figure 5:
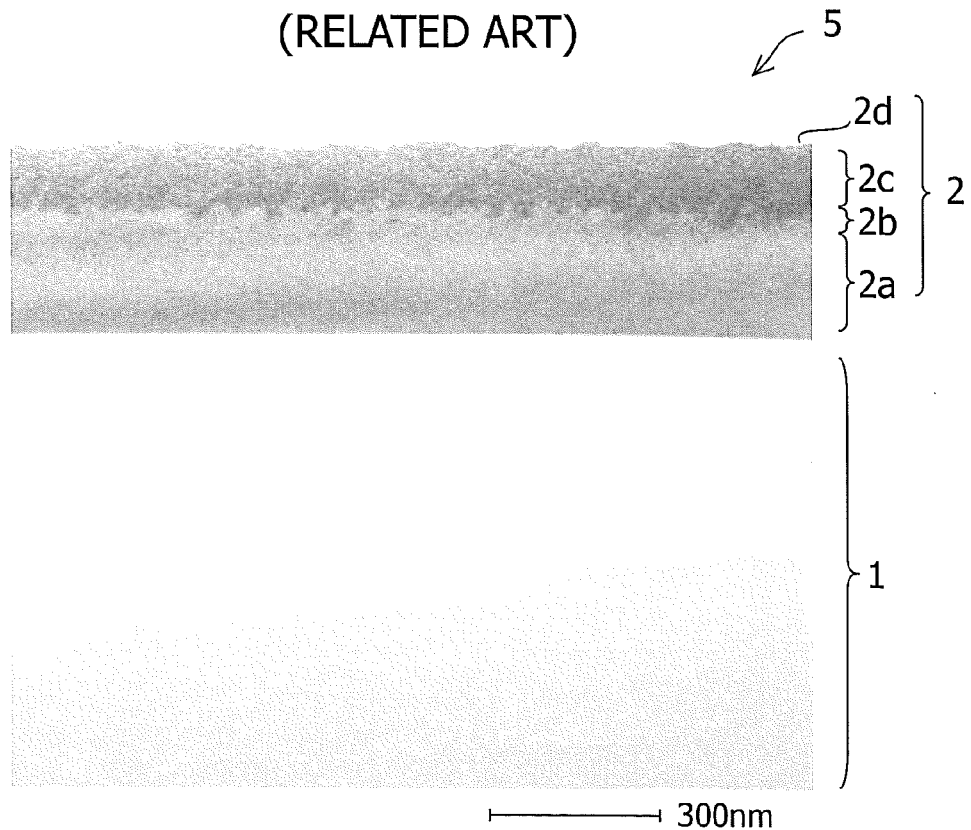
FIG. 5 shows a cross-sectional TEM image of the SOQ substrate immediately after peeling.

FIG. 5 shows a cross-sectional TEM image of one of the obtained SOQ wafers.

Examples 1 to 6 and Comparative Examples 1 to 3

Several SOQ substrates after peeling were provided and subjected to the treatment described below. The alkaline solution used was SC1 solution having an etching effect enhanced by intentionally reducing the amount of aqueous hydrogen peroxide. The composition was $NH_4OH:H_2O_2:H_2O=1:0.2:10$, and the treatment temperature was 80° C. The etched amount was changed by changing the immersion time. Each of the etched substrates was sandblasted with a sandblasting apparatus by spraying alumina fine powder having an average particle size of 10 μm, while protective tape (D636 manufactured by Lintec Corporation) was attached to each etched substrate. Consequently, the substrate had a surface roughness (center line average roughness Ra) of 500 nm. Then, the protective tape was removed, cleaning was performed using hydrofluoric acid, and polishing was performed by CMP. Thus, the SOI substrates having the backside roughened were completed. The etched amounts were 10 nm (Example 1), 15 nm (Example 2), 20 nm (Example 3), 30 nm (Example 4), 40 nm (Example 5), 50 nm (Example 6), 6 nm (Comparative Example 2), and 8 nm (Comparative Example 3). In Comparative Example 1, the substrate was obtained by attaching protective tape thereto; then removing the protective tape without etching; and polishing and cleaning.

Figure 2:
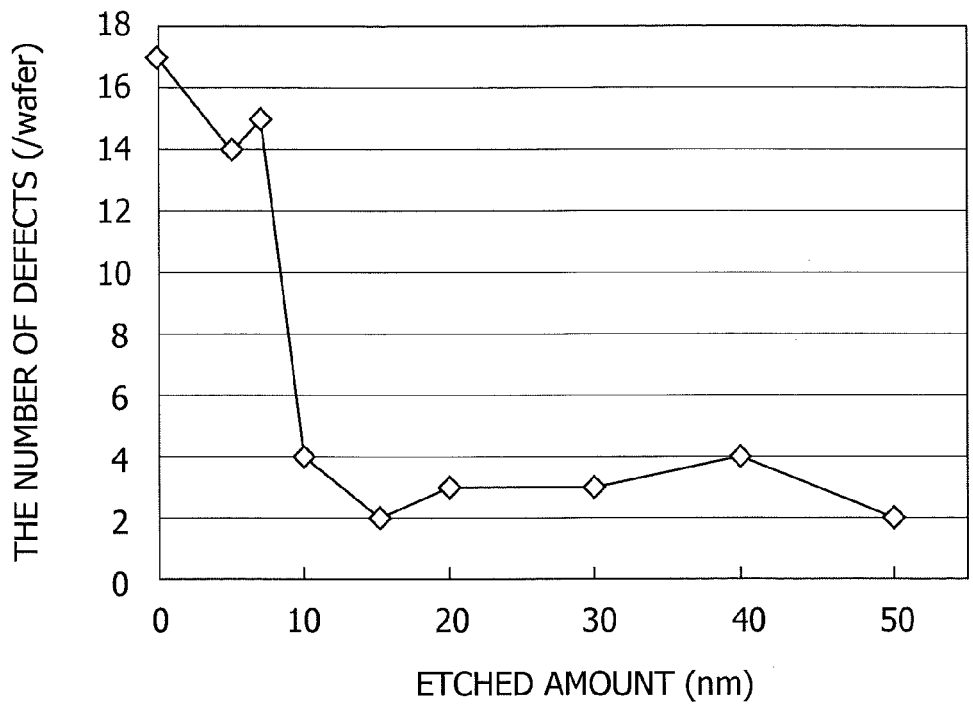
FIG. 2 shows a graph exhibiting a relationship between an etched amount and the number of defects in the silicon surface of the obtained SOQ substrate.

The completed substrates were immersed in 50% by weight hydrofluoric acid for three minutes. Then, for each completed substrate, the number of defects was counted by visual inspection. The results are shown in FIG. 2.

It is evident based on the results of Examples 1 to 6 and Comparative Examples 1 to 3 that any substrate in which 10 nm or more of a silicon surface has been etched have a reduced number of defects.

Examples 7 to 11

SOQ substrates each having 30 nm of the silicon layer etched away and each having a backside roughened were completed in the same manner as in Example 4 except for use of $NH_4OH$ (Example 7), KOH (Example 8), NaOH (Example 9), TMAH (Example 10), or EDP (Example 11) instead of the SC1 solution as the alkaline solution.

Each of the completed substrates was immersed in 50% by weight hydrofluoric acid for three minutes. Then, the number of defects was counted. The results are shown in FIG. 3.

It is evident based on the results of Examples 4 and 7 to 11 that the influence of difference in the type of etchant used to etch the silicon layer is small.

Having thus described certain embodiments of the present invention, it is to be understood that the invention defined by the appended claims is not to be limited by particular details set forth in the above description as many apparent variations thereof are possible without departing from the spirit or scope thereof as hereinafter claimed. The following claims are provided to ensure that the present application meets all statutory requirements as a priority application in all jurisdictions and shall not be construed as setting forth the full scope of the present invention.

The invention claimed is:

1. A method of preparing an SOI substrate having a backside roughened, consisting essentially of the steps of:
    etching 10 nm or more of a surface of a silicon film of an SOI substrate;
    sandblasting the backside of the SOI substrate after the step of etching and with protective tape attached to the etched surface of the silicon film, the backside being the other side of the SOI substrate from the etched surface;
    removing the protective tape after the step of sandblasting; and
    polishing and cleaning a silicon film surface from which the protective tape has been removed.

2. The method according to claim 1, wherein said backside of the SOI substrate to be sandblasted in the sandblasting has been cleaned before the sandblasting so as to remove organic contaminants.

3. The method according to claim 1,
    wherein said SOI substrate to be etched in the etching step is obtained by a method comprising the steps of:
    implanting hydrogen ions into a surface of a single-crystal silicon substrate to form a ion-implanted layer in the single-crystal silicon substrate;
    bonding together an insulating substrate and the ion-implanted surface of the single-crystal silicon substrate; and
    after the bonding, peeling off a silicon film on the insulating substrate at the ion-implanted layer to obtain said SOI substrate having a silicon film transferred onto the insulating substrate
    so that the silicon film of said SOI substrate to be etched is the peeled silicon film.

4. The method according to claim 3, wherein said insulating substrate is a quartz substrate, a glass substrate or a sapphire substrate.

5. The method according to claim 3, wherein said etching step comprises use of an alkaline etchant, the alkaline etchant comprising one or more selected from the group consisting of APM, ammonia, potassium hydroxide, sodium hydroxide, cesium hydroxide, tetramethyl ammonium hydroxide, an ethylene diamine-pyrocatechol-water mixture (EDP) and hydrazine.

6. The method according to claim 3, wherein said protective tape is protective tape for backgrinding, tape for dicing, or tape for die bonding.

7. The method according to claim 6, wherein said step of removing the protective tape comprises cleaning the sandblasted surface with a solution containing HF and removing the protective tape after said sandblasting.

8. The method according to claim 2,
    wherein said SOI substrate to be etched in the etching step is obtained by a method comprising the steps of:
    implanting hydrogen ions into a surface of a single-crystal silicon substrate to form a ion-implanted layer in the single-crystal silicon substrate;
    bonding together an insulating substrate and the ion-implanted surface of the single-crystal silicon substrate; and
    after the bonding, peeling off a silicon film on the insulating substrate at the ion-implanted layer to obtain said SOI substrate having a silicon film transferred onto the insulating substrate
    so that the silicon film of said SOI substrate to be etched is the peeled silicon film.

9. The method according to claim 8, wherein said etching step comprises use of an alkaline etchant, the alkaline etchant comprising one or more selected from the group consisting of APM, ammonia, potassium hydroxide, sodium hydroxide, cesium hydroxide, tetramethyl ammonium hydroxide, an ethylene diamine-pyrocatechol-water mixture (EDP) and hydrazine.

10. The method according to claim 8, wherein said protective tape is protective tape for backgrinding, tape for dicing, or tape for die bonding.

11. The method according to claim 8, wherein said step of removing the protective tape comprises cleaning the sandblasted surface with a solution containing HF and removing the protective tape after said sandblasting.

12. The method according to claim 8, wherein said insulating substrate is a quartz substrate, a glass substrate or a sapphire substrate.

* * * * *